(12) United States Patent
Zhao

(10) Patent No.: US 9,825,630 B2
(45) Date of Patent: Nov. 21, 2017

(54) SINGLE POLE-SINGLE-THROW (SPST) SWITCH AND ITS DERIVATIVE SINGLE POLE-DOUBLE-THROW (SPDT) AND SINGLE-POLE-MULTIPLE-THROW (SPMT) SWITCHES

(71) Applicant: Huan Zhao, Irvine, CA (US)

(72) Inventor: Huan Zhao, Irvine, CA (US)

( * ) Notice: Subject to any disclaimer, the term of this patent is extended or adjusted under 35 U.S.C. 154(b) by 0 days.

(21) Appl. No.: 15/230,366

(22) Filed: Aug. 5, 2016

(65) Prior Publication Data

US 2017/0040996 A1    Feb. 9, 2017

(30) Foreign Application Priority Data

Aug. 7, 2015    (CN) .......................... 2015 1 0481742

(51) Int. Cl.
    *H03K 17/693*    (2006.01)
(52) U.S. Cl.
    CPC ................... *H03K 17/693* (2013.01)
(58) Field of Classification Search
    None
    See application file for complete search history.

(56) References Cited

U.S. PATENT DOCUMENTS

| | | | | |
|---|---|---|---|---|
| 4,890,077 A * | 12/1989 | Sun | .......................... | H01P 1/227 257/277 |
| 7,848,712 B2 * | 12/2010 | Fu | .......................... | H03K 17/145 333/100 |
| 8,228,112 B2 * | 7/2012 | Reynolds | ............. | G06F 17/5063 327/108 |
| 8,288,829 B2 * | 10/2012 | Zhang | .................. | H01L 27/0207 257/343 |
| 8,724,736 B2 * | 5/2014 | Bellaouar | .............. | H03F 1/0261 375/258 |
| 9,148,137 B2 * | 9/2015 | van Wanum | .......... | H03K 17/693 |
| 9,197,194 B2 * | 11/2015 | Reedy | ................. | H03M 1/1061 |

(Continued)

*Primary Examiner* — Thomas J Hiltunen
(74) *Attorney, Agent, or Firm* — Robert Kasody; Anthony King

(57) ABSTRACT

A Single-Pole-Single-Throw (SPST) switch for RF application is disclosed that can include a semiconductor MOSFET transistor T, wherein its drain terminal can be connected to a resistor R3 and capacitor C2. It can have a source terminal connected to a resistor R1 and capacitor C1, a gate terminal connected to resistor R2, a body connected by resistor R4 to GND, and the body can be connected to the anode of a diode DE The Cathode of diode D1 can be connected to a power supply Vdd through a resistor R6. The Cathode of diode D1 can also be connected to the cathode of another diode D2. The anode of D2 can be connected to GND through resistor R5. Capacitor C1 can be connected to an I/O port P1, and capacitor C2 can be connected to an I/O port P2. Inductor L1 can connect to ports P1 and P2, while inductor L2 can connect the source terminal and drain terminal of MOSPET T. This disclosure also provides a Single-Pole-Double-Throw (SPDT) switch and Single-Pole-Multiple-Throw (SPMT) switch based on the proposed SPST concept. The SPST disclosed can offer higher isolation and higher linearity to the transmit (TX) arm of the Radio-Frequency Front-End-Module (RF FEM), while maintaining relatively good performance in the receive (RX) arm of the RF FEM.

12 Claims, 6 Drawing Sheets

(56) References Cited

U.S. PATENT DOCUMENTS

| | | | | |
|---|---|---|---|---|
| 9,450,639 B2* | 9/2016 | Zhang | ................... | H04B 1/006 |
| 2003/0190895 A1* | 10/2003 | Mostov | ................... | H04B 1/48 |
| | | | | 455/78 |
| 2005/0093026 A1* | 5/2005 | Sagae | ..................... | H01P 1/15 |
| | | | | 257/213 |
| 2014/0084997 A1* | 3/2014 | Simmonds | ............. | H01L 25/00 |
| | | | | 327/564 |
| 2015/0070075 A1* | 3/2015 | Keane | ................. | H03K 17/693 |
| | | | | 327/389 |
| 2015/0180466 A1* | 6/2015 | Kishimoto | ........... | H03K 17/162 |
| | | | | 327/382 |
| 2016/0028391 A1* | 1/2016 | Li | ....................... | H03K 17/687 |
| | | | | 327/374 |
| 2016/0156178 A1* | 6/2016 | Yamamoto | ........... | H03K 17/693 |
| | | | | 361/16 |
| 2016/0268983 A1* | 9/2016 | Matsuno | ................ | H03F 3/195 |

* cited by examiner

SINGLE POLE-SINGLE-THROW (SPST) SWITCH AND ITS DERIVATIVE SINGLE POLE-DOUBLE-THROW (SPDT) AND SINGLE-POLE-MULTIPLE-THROW (SPMT) SWITCHES

CROSS-REFERENCE TO RELATED APPLICATIONS

This application claims foreign priority to China Invention Patent Application No. 201510481742.5 filed on Aug. 7, 2015, now pending, which is hereby incorporated by reference in its entirety.

Although incorporated by reference in its entirety, no arguments or disclaimers made in the related application apply to this application. Any disclaimer that may have and occurred or might occur during the prosecution of the above-referenced application is hereby expressly rescinded.

STATEMENT REGARDING FEDERALLY SPONSORED RESEARCH OR DEVELOPMENT

Not Applicable.

THE NAMES OF THE PARTIES TO A JOINT RESEARCH AGREEMENT

Not Applicable.

FIELD OF THE DISCLOSURE

The field of the disclosure is integrated circuit design, especially Single-Pole-Single-Throw (SPST) switch and its radio frequency power applications in Single-Pole-Double-Throw (SPDT) and Single-Pole-Multiple-Throw (SPMT).

BACKGROUND OF THE DISCLOSURE

The trend of modern wireless communication technology is to create smaller and smaller devices that have lower power consumptions. This demands the miniaturization of components in all aspects, including its size, weight, and thickness.

Radio-Frequency Front-End-Module (RF FEM) amplifies transmitted signal coming from a radio transceiver, and amplifies received signal coming from the air at very low level. It is a vital component of any modern communication systems. The SPST, SPDT and SPMT switches are used to control the signal flow of the RF FEM.

Existing solutions for RF power switches utilize a variety of semiconductor technologies: 1) PIN diode, with the drawback of narrower operating frequency and complex control circuitry; 2) GaAs pHEMT, with the advantage of being small in size, but is difficult to integrate with transceivers and is relatively expensive; 3) silicon, with the advantages of lower cost and higher applicability of integration with transceivers, and with the drawbacks of inferior handling capability for high power and high voltage. In addition, existing silicon solutions for RF power switches suffer from high insertion loss, poor isolation, and long responding time. Therefore, to meet the ever-evolving and stringent specifications of modern wireless communication systems, there is a need for new solutions for RF power switches.

All referenced patents, applications and literatures are incorporated herein by reference in their entirety. Furthermore, where a definition or use of a term in a reference, which is incorporated by reference herein, is inconsistent or contrary to the definition of that term provided herein, the definition of that term provided herein applies and the definition of that term in the reference does not apply. The embodiment may seek to satisfy one or more of the above-mentioned desires. Although the present embodiment may obviate one or more of the above-mentioned desires, it should be understood that some aspects of the embodiment might not necessarily obviate them.

BRIEF SUMMARY OF THE DISCLOSURE

This disclosure proposes embodiments of a fundamental building block of RF FEM SPST switch. Some of the disclosed embodiments, while compared with existing solutions, can offer higher linearity, higher isolation and lower spurious harmonics to the transmit arm TX, while maintaining good performance for the receive arm RX to the RF FEM used in a Time-Domain-Diplexing (TDD) system.

Some embodiments of the disclosure also proposes a SPDT switch architecture based upon the proposed SPST switch, which can offer higher linearity and higher power handling capability.

Other embodiments of the disclosure also proposes a SPMT switch architecture based on the proposed SPST switch, which can offer higher linearity and higher power handling capability.

In one embodiment, a Single-Pole-Single-Throw (SPST) Switch is disclosed to have a semiconductor MOSFET transistor with a drain terminal connected to a resistor R3 and a capacitor C2; a source terminal connected to a resistor R1 and a capacitor C1; a gate terminal connected to a resistor R2; a body connected to a resistor R4 to a GND and connected to a diode D1 through an anode of diode D1. In one aspect of the disclosed embodiment, a cathode of the diode D1 is connected to a power supply VDD through a resistor R6 while connecting to a cathode of a diode D2. In another aspect of the disclosed embodiment, an anode of the diode D2 is connected to the GND through a resistor R5, and wherein the capacitor C1 is connected to an I/O port P1, and the capacitor C2 is connected to an I/O port P2.

In one embodiment, there can be an inductor L1 that connects the I/O port P1 and the I/O port P2. In yet another embodiment, there can be an inductor L2 that connects a source terminal and a drain terminal of the MOSFET transistor T. The disclosed inductor L1 can work in a parallel-resonance mode when the switch is in an OFF mode. In yet another embodiment, the inductor L2 can work as a part of an Impedance Transformation Network when the switch is ON.

In one embodiment, the MOSFET transistor T can be one of NMOS, PMOS, HEMT, and LDMOS.

Another aspect of the disclosure provides a switch having a transmit arm TX that can connect an I/O port Antenna P4 (ANT) to an I/O port P5, and a first receive arm RX that can connect an I/O port P3 to an I/O port Antenna P4.

In one embodiment, the transmit arm TX can include a Single-Pole-Single-Throw Switch having a semiconductor MOSFET transistor with a drain terminal connected to a resistor R3 and a capacitor C2; a source terminal connected to a resistor R1 and a capacitor C1; a gate terminal connected to a resistor R2; a body connected to a resistor R4 to a GND and connected to a diode D1 through an anode of diode D1; wherein a cathode of the diode D1 is connected to a power supply VDD through a resistor R6 while connecting to a cathode of a diode D2; and wherein an anode of the diode D2 is connected to the GND through a resistor R5, and wherein the capacitor C1 is connected to an I/O port P1, and the capacitor C2 is connected to an I/O port P2.

In another embodiment, the transmit arm TX can include a Single-Pole-Single-Throw (SPST) Switch having an inductor L1 which connects the I/O port P1 and the I/O port P2.

In yet another embodiment, the switch can have a second receive arm RX, wherein the I/O port P1 can connect to a Low-Noise-Amplifier (LNA) B through a capacitor C3, and said I/O port P2 can connect to said I/O port Antenna P4 (ANT), and an output of said Low-Noise-Amplifier (LNA) B can connect to the I/O port P3 (RX).

Alternatively and optionally, the switch can have a plurality of mounting points for Electro-Static-Discharge (ESD) components, wherein some of the plurality of mounting points can be disposed at position E1 located between a capacitor C3 and a Single-Pole-Double-Throw (SPST) switch in the receiving arm RX.

In some embodiments, the contemplated plurality of mounting points can be disposed at position E2 at P4.

In other embodiments, some the plurality of mounting points can be disposed at position E3 at P5.

In some embodiments of the switch, at least one mounting points for ESD can connect to a ESD component, which can be one of the following: an ESD diode, an ESD BJT, and a grounded inductor.

The switch as disclosed can optionally include a shunt switch, wherein the shunt switch can have a first terminal connecting a junction of a Low-Noise-Amplifier (LNA) B and a capacitor C, and the shunt switch can have a second terminal connecting to a ground, wherein the shunt switch can be one of a PMOS, a NMOS, a HEMT, and a LDMOS.

Various objects, features, aspects and advantages of the present embodiment will become more apparent from the following detailed description of embodiments of the embodiment, along with the accompanying drawings in which like numerals represent like components.

BRIEF DESCRIPTION OF THE DRAWINGS

It should be noted that the drawing figures may be in simplified form and might not be to precise scale. In reference to the disclosure herein, for purposes of convenience and clarity only, directional terms such as top, bottom, left, right, up, down, over, above, below, beneath, rear, front, distal, and proximal are used with respect to the accompanying drawings. Such directional terms should not be construed to limit the scope of the embodiment in any manner.

FIG. 3 shows the equivalent circuit when one embodiment of the proposed SPST is ON.

DETAILED DESCRIPTION OF THE EMBODIMENTS

The embodiment and its various embodiments can now be better understood by turning to the following detailed description of the embodiments, which are presented as illustrated examples of the embodiment defined in the claims. It is expressly understood that the embodiment as defined by the claims may be broader than the illustrated embodiments described below.

Many alterations and modifications may be made by those having ordinary skill in the art without departing from the spirit and scope of the embodiment. Therefore, it must be understood that the illustrated embodiment has been set forth only for the purposes of example and that it should not be taken as limiting the embodiment as defined by the following claims. For example, notwithstanding the fact that the elements of a claim are set forth below in a certain combination, it must be expressly understood that the embodiment includes other combinations of fewer, more or different elements, which are disclosed herein even when not initially claimed in such combinations.

The words used in this specification to describe the embodiment and its various embodiments are to be understood not only in the sense of their commonly defined meanings, but to include by special definition in this specification structure, material or acts beyond the scope of the commonly defined meanings. Thus if an element can be understood in the context of this specification as including more than one meaning, then its use in a claim must be understood as being generic to all possible meanings supported by the specification and by the word itself.

In many of the embodiments discussed herein, the MOSFET transistor T can be one of NMOS, PMOS, HEMT, and LDMOS, or any other suitable MOSFET transistor.

In one aspect of the embodiments, the contemplated switch may be provided on either or both ends of a RF transmission system to improve quality of transmission. In one embodiment, ultra high definition satellite television signal transmission can be achieved.

Figure 1:
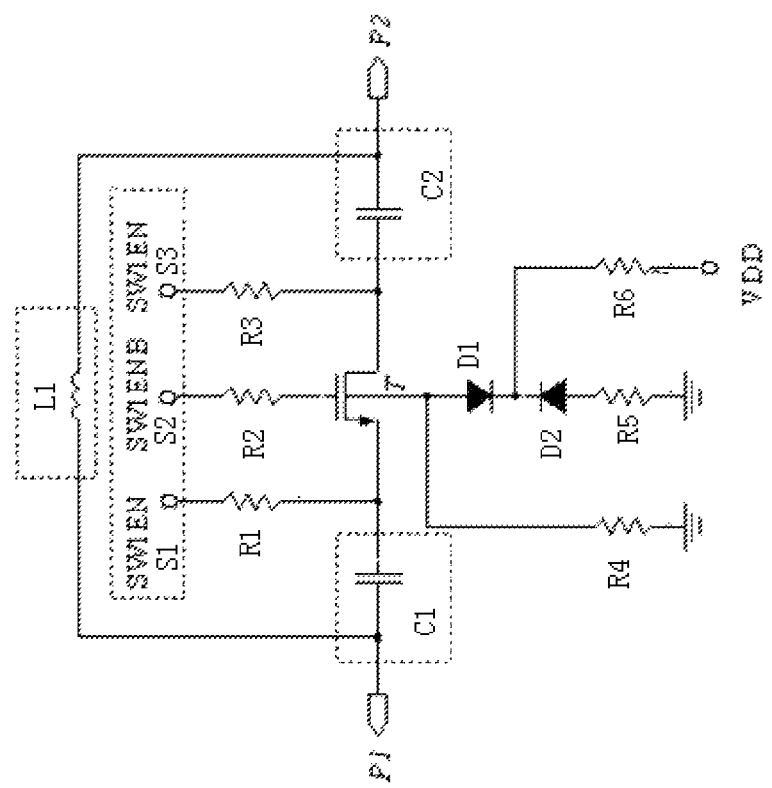
FIG. 1 shows the schematic of an embodiment of the proposed SPST.

Referring now to FIG. 1, a schematic of an embodiment of a SPST switch having a semiconductor MOSFET transistor with a drain terminal connected to a resistor R3 and a capacitor C2; a source terminal connected to a resistor R1 and a capacitor C1. The MOSFET has a gate terminal connected to a resistor R2, and a body connected to a resistor R4 to a GND and connected to a diode D1 through an anode of diode D1. In one aspect, the cathode of the diode D1 is connected to a power supply VDD through a resistor R6 while connected to a cathode of a diode D2. In another aspect of the disclosed embodiment, the anode of the diode D2 is connected to the GND through a resistor R5.

Contemplated capacitor C1 is connected to an I/O port P1, and the capacitor C2 is connected to an I/O port P2.

In some embodiments, there can be an inductor L1 that connects the I/O port P1 and the I/O port P2. The inductor L1 can work in a parallel-resonance mode when the switch is in an OFF mode.

Figure 2:
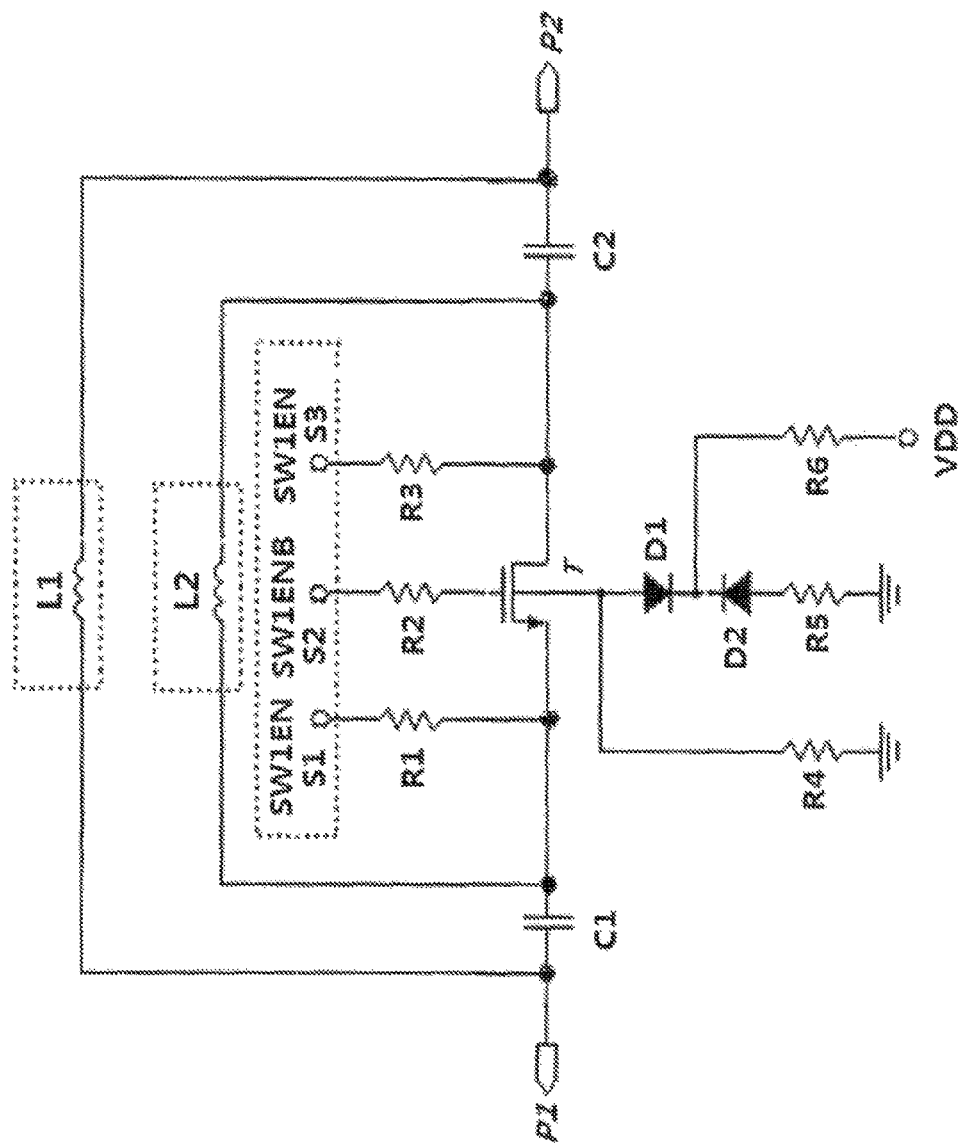
FIG. 2 shows the schematic of another embodiment the proposed SPST.

Referring now to the embodiment shown in FIG. 2, which can have an inductor L1 and an inductor L2 that connects a source terminal and a drain terminal of the MOSFET transistor T. The disclosed inductor L1 can work in a parallel-resonance mode when the switch is in an OFF mode. In yet another embodiment, the inductor L2 can work as a part of an Impedance Transformation Network when the switch is ON.

Figure 3:
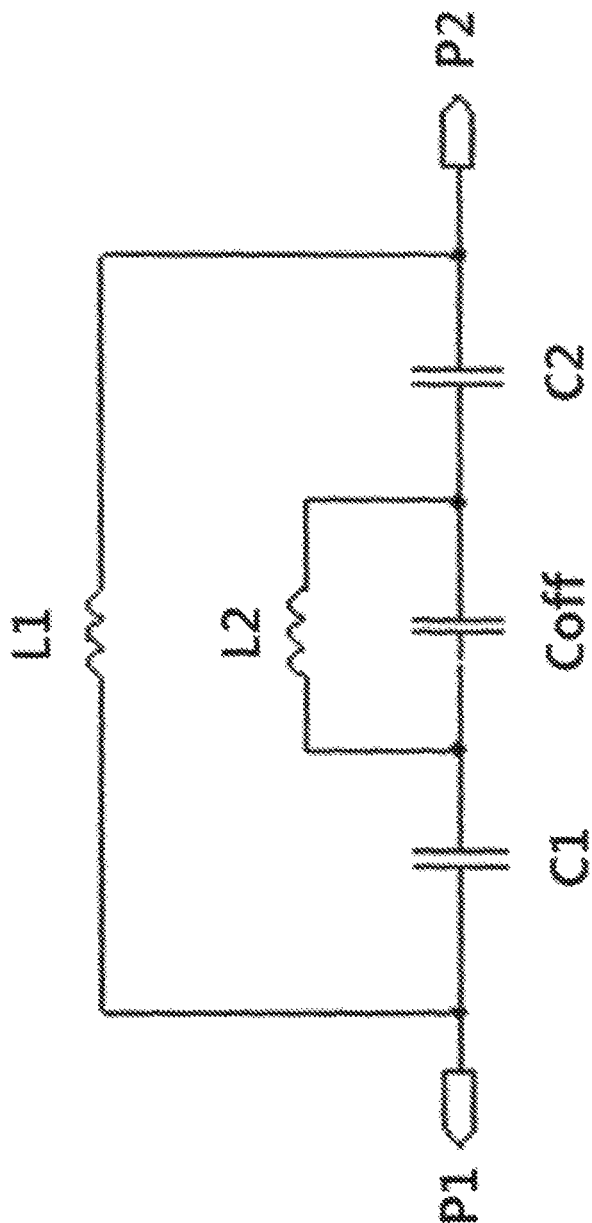

FIG. 3 illustrates the SPST when the SPST switch is ON. Here, SW1EN is set to HIGH, SW1ENB is set to LOW, and MOSFET T is turned off. In this case, MOSFET T is equivalent to a capacitor with low capacitance value Coff. Inductor L2 and Coff thus forms a parallel LC network. Based on the choice of inductance value of L2, this LC network can provide varieties of impedances in the operating frequency of interest. The LC network connects to capacitors C1 and C2 in the series configuration and then forms another parallel network with inductor L1. The combinations of C1, C2, L2 and Coff can be designed carefully to effectively tune the inductance value of L1.

Inductor L1 and L2 can be designed to meet different RF FEM requirements simultaneously, which cannot be implemented in the prior art. In general, the value of L1 is designed in favor of isolation between P1 and P2. As long as L1 is determined, L2 is designed to match the optimal impedance value desired by the Low-Noise-Amplifier LNA, which is connected to the SPST switch as in FIG. 5 or FIG. 6. It can be categorized into the following three cases:

a) If L1 is designed to achieve the best isolation, and the value of L1 is too high to match the optimal impedance desired by LNA. The value of L2 can be chosen so that the self-resonance-frequency (SRF) of L2/Coff network is higher than the operating frequency of interest, and thus the LC network is equivalent to an inductor with a value L2A1 higher than L2. After connecting in series to C1 and C2, this inductance value L2A1 is reduced to L2A2. Eventually, the parallel network of L2A2 and L1 forms a inductance value lower than L1, and thus provides LNA its desired impedance.

b) If L1 is designed to be lower than what LNA desires, L2 can be tuned in such a way that the SRF of L2/Coff network is lower than the operating frequency, and thus the LC network is equivalent to a capacitor CB1 (lower than Coff). CB1 connects in series with C1 and C2, and the equivalent capacitance is CB2 (lower than CB1). Eventually, CB2 forms a parallel network with L1 and effectively boosts the value of L1.

c) If L1 coincides with what LNA desires, L2 can be tuned to resonate with Coff exactly at the operating frequency. In this case, a high impedance is formed between C1 and C2, and only L1 is in effect.

Therefore, the proposed SPST switch serves not only as a RF switch, but also a part of the Impedance Transformation Network (ITN) or Impedance Matching Network (IMN) for the LNA.

Figure 4:
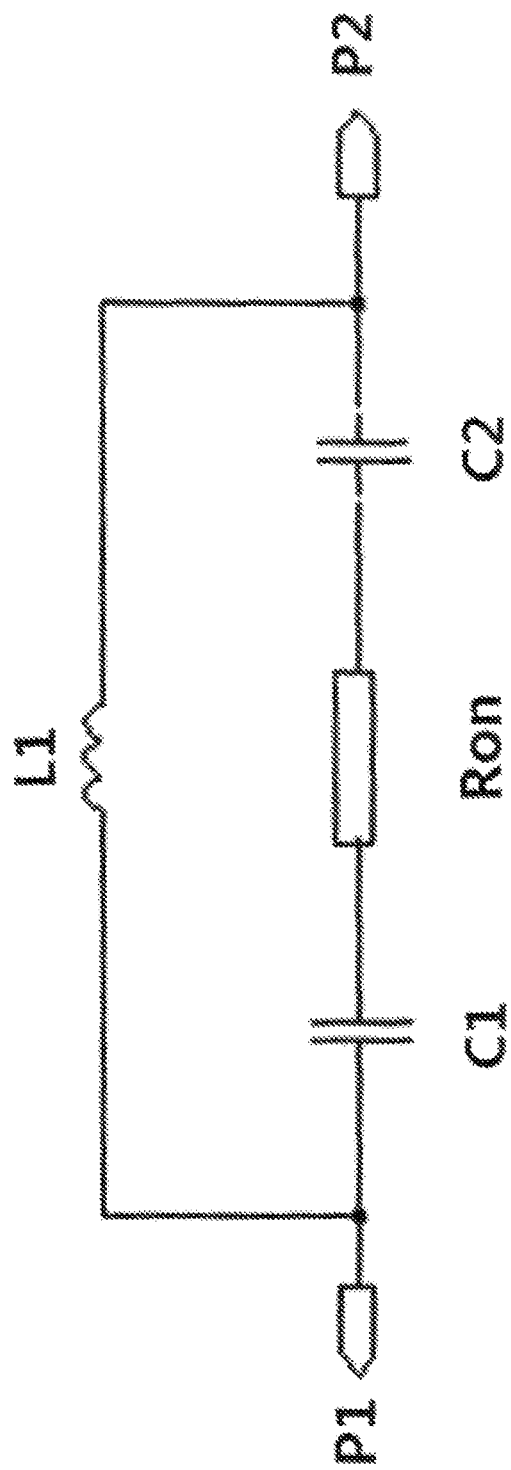
FIG. 4 shows the equivalent circuit when one embodiment of the proposed SPST is OFF.

Referring now to FIG. 4 where the SPST switch is OFF. When it is off, SW1EN is set to LOW, SW1ENB is set to HIGH, and MOSFET T is turned on. In this case, MOSFET T is equivalent to a resistor with low resistance, hence effectively shorting inductor L2. It also effectively connects capacitor C1 and C2 in series, and forms a parallel LC resonance tank circuit, with the effective inductance equivalent to the inductance of L1 and the effective capacitance of capacitor C1 in series with capacitor C2. This configuration forms a high impedance between I/O ports P1 and P2, and thus provide a high isolation between two ports.

In some embodiments, since the DC decoupling capacitors C1 and C2 are usually tuned in such a way that they resonate with L1, their sizes are significantly smaller than the DC decoupling capacitors in the conventional way, which further miniatures the form factor of the semiconductor chip.

Figure 5:
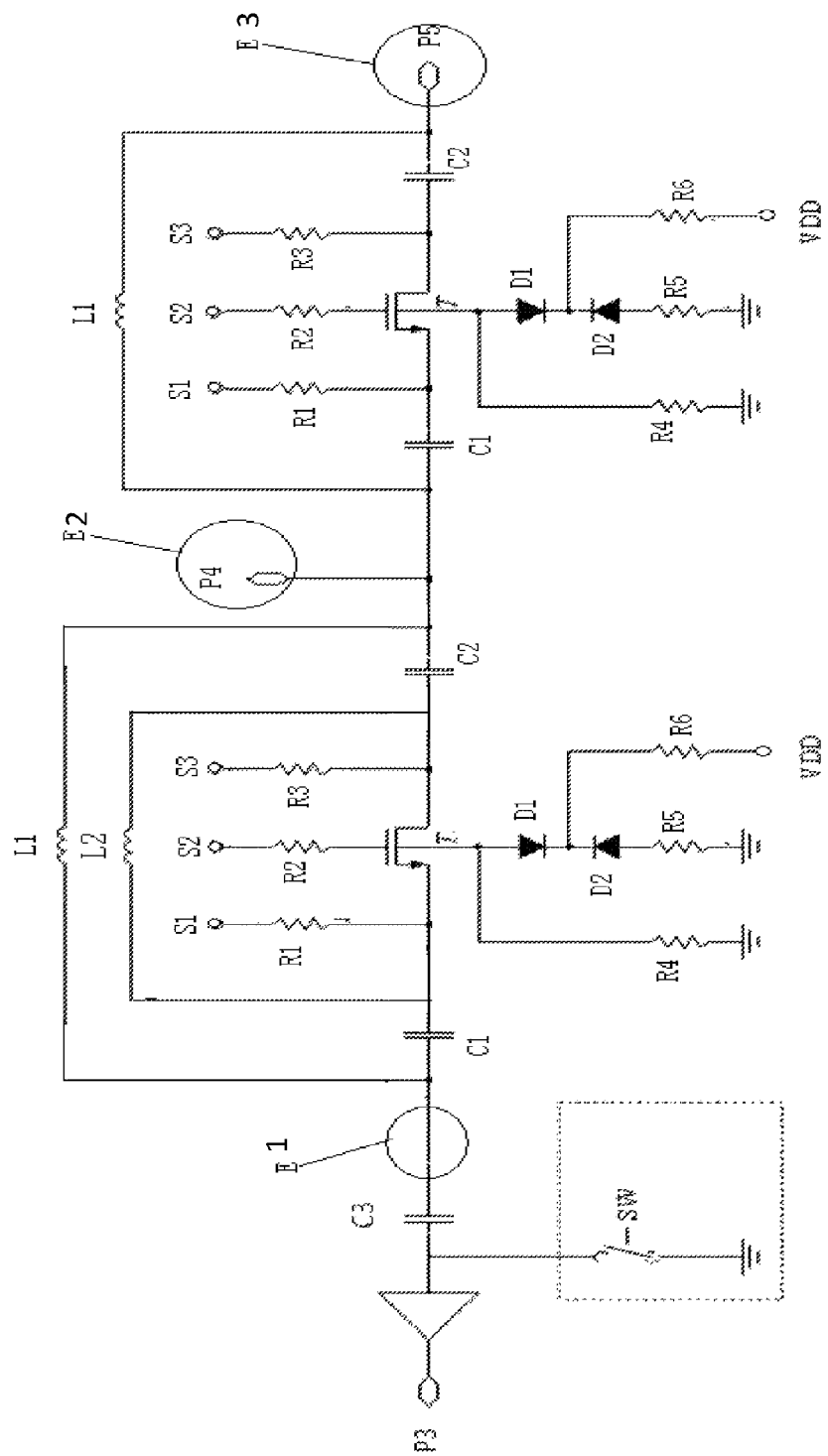
FIG. 5 shows an architecture of one embodiment of the proposed SPDT using the proposed SPST.
Figure 6:
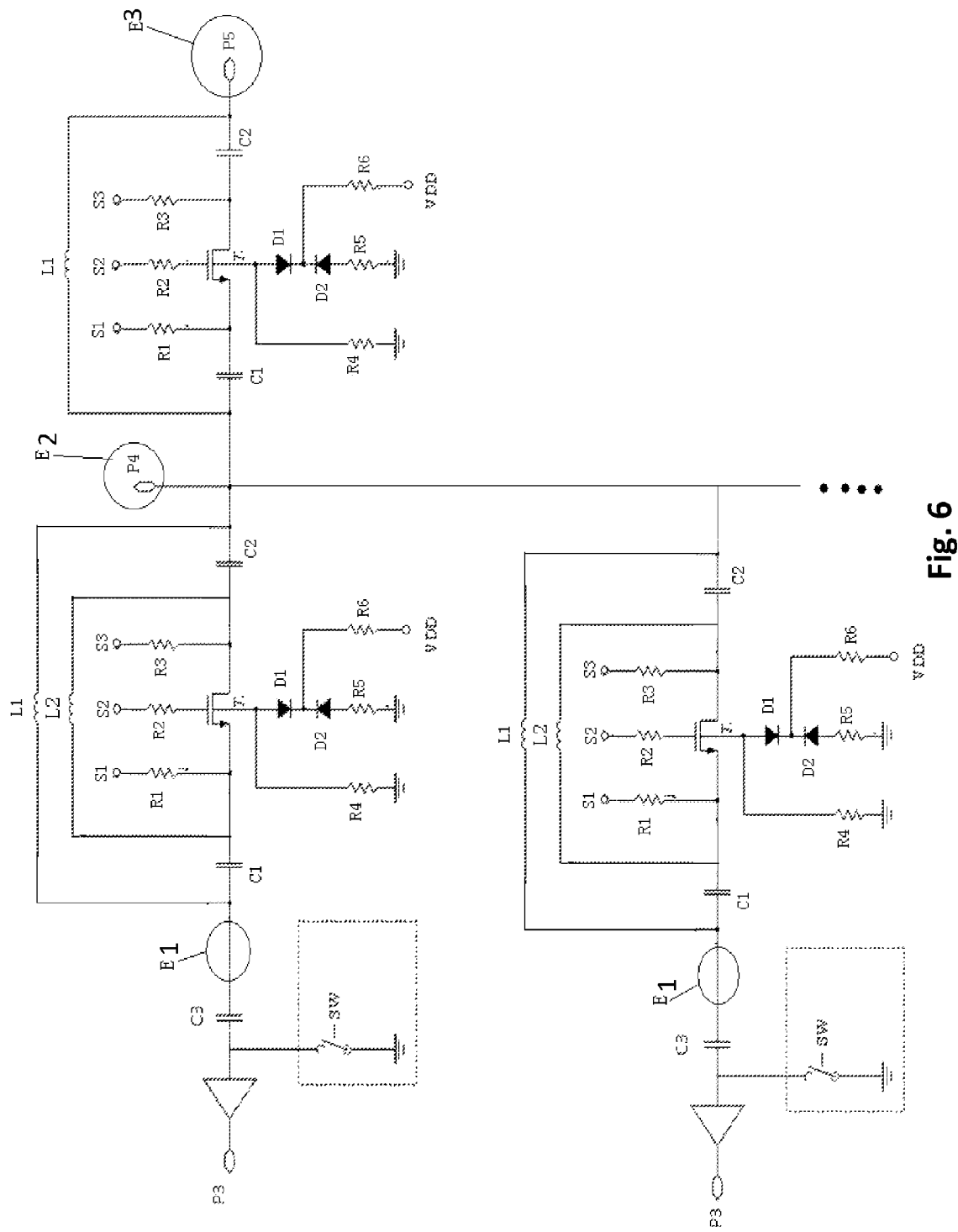
FIG. 6 shows an architecture of the one embodiment of the proposed SPMT using the proposed SPST.

The proposed SPST can be incorporated into SPDT (as shown in FIG. 5) or SPMT (as shown in FIG. 6) switches. In some contemplated embodiments, the SPMT is composed of m RX arms and n TX arms, where m≥2, n≥1. Since each TX or RX arm has inductors connecting to both of its I/O ports, a DC or low-frequency short circuit is thus formed. This is especially useful to ESD floor-planning, since multiple points are protected in the ESD as long as one of these points is connected with an ESD protecting device.

In FIG. 6, the switch as disclosed can optionally include a shunt switch, wherein the shunt switch can have a first terminal connecting a junction of a Low-Noise-Amplifier (LNA) B and a capacitor C, and the shunt switch can have a second terminal connecting to a ground, wherein the shunt switch can be one of a PMOS, a NMOS, a HEMT, and a LDMOS.

Thus, specific embodiments and applications of a switch have been disclosed. It should be apparent, however, to those skilled in the art that many more modifications besides those already described are possible without departing from the disclosed concepts herein. The embodiment, therefore, is not to be restricted except in the spirit of the appended claims. Moreover, in interpreting both the specification and the claims, all terms should be interpreted in the broadest possible manner consistent with the context. In particular, the terms "comprises" and "comprising" should be interpreted as referring to elements, components, or steps in a non-exclusive manner, indicating that the referenced elements, components, or steps may be present, or utilized, or combined with other elements, components, or steps that are not expressly referenced. Insubstantial changes from the claimed subject matter as viewed by a person with ordinary skill in the art, now known or later devised, are expressly contemplated as being equivalent within the scope of the claims. Therefore, obvious substitutions now or later known to one with ordinary skill in the art are defined to be within the scope of the defined elements. The claims are thus to be understood to include what is specifically illustrated and described above, what is conceptually equivalent, what can be obviously substituted and also what essentially incorporates the essential idea of the embodiment. In addition, where the specification and claims refer to at least one of something selected from the group consisting of A, B, C . . . and N, the text should be interpreted as requiring only one element from the group, not A plus N, or B plus N, etc.

What is claimed is:

1. A Single-Pole-Single-Throw (SPST) Switch comprising:
   a semiconductor MOSFET transistor (T) with a drain terminal directly connected to a resistor (R3) and a capacitor (C2);
   a source terminal directly connected to a resistor (R1) and a capacitor (C1);
   a gate terminal connected to a resistor (R2);
   a body connected to a resistor (R4) to a GND and connected to a diode (D1) through an anode of diode (D1); and
   an inductor (L2) which connects the source terminal and the drain terminal of the MOSFET transistor (T);
   wherein a cathode of the diode (D1) is connected to a power supply (VDD) through a resistor (R6) while connecting to a cathode of a diode (D2);
   wherein an anode of the diode (D2) is connected to the GND through a resistor (R5);
   wherein the capacitor (C1) is connected to an I/O port (P1), and the capacitor (C2) is connected to an I/O port (P2).

2. The switch as recited in claim 1 further comprising an inductor (L1) which connects the I/O port (P1) and the I/O port (P2).

3. The switch as recited in claim 2, wherein the inductor (L1) works in a parallel-resonance mode when the switch is in an OFF mode.

4. The switch as recited in claim 1, wherein the inductor (L2) works as a part of an Impedance Transformation Network when the switch is ON.

5. The switch as recited in claim 1, wherein the MOSFET transistor (T) is one of NMOS, PMOS, HEMT, and LDMOS.

6. The switch comprising:
 a transmit arm (TX), which connects an I/O port Antenna (P4) (ANT) and an I/O port (P5); and
 a first receive arm (RX), which connects an I/O port (P3) and the I/O port Antenna (P4); wherein the transmit arm (TX) and the first receive arm (RX) include the Single-Pole-Single-Throw (SPST) Switch as recited in claim 1.

7. The switch as recited in claim 6, further comprising an inductor (L1) which connects the I/O port (P1) and the I/O port (P2).

8. The switch as recited in claim 6 further comprising a second receive arm (RX), wherein the I/O port (P1) is connected to a Low-Noise-Amplifier (LNA) B through a capacitor (C3), and the I/O port (P2) is connected to said I/O port Antenna (P4) (ANT), and an output of said Low-Noise-Amplifier (LNA) B is connected to the I/O port (P3) (RX).

9. The switch as recited in claim 8, further comprising an inductor (L1) which connects the I/O port (P1) and the I/O port (P2).

10. The switch as recited in claim 6 further comprising a plurality of mounting points for Electro-Static-Discharge (ESD) components, wherein some of the plurality of mounting points are disposed at position (E1) located between a capacitor (C3) and a Single-Pole-Double-Throw (SPST) switch in the receiving arm (RX);
 wherein some of the plurality of mounting points are disposed at position (E2) at (P4); and
 wherein some of the plurality of mounting points are disposed at position (E3) at (P5).

11. The switch as recited in claim 10, wherein at least one of the plurality of mounting points for ESD is connected to a ESD component, which is one of the following: an ESD diode, an ESD BJT, and a grounded inductor.

12. The switch as recited in claim 6 further comprising a shunt switch, wherein the shunt switch has a first terminal connecting a junction of a Low-Noise-Amplifier (LNA) B and a capacitor C, and the shunt switch has a second terminal connecting to a ground, wherein the shunt switch is one of a PMOS, a NMOS, a HEMT, and a LDMOS.

* * * * *